(12) United States Patent
Ghannam

(10) Patent No.: US 8,971,373 B2
(45) Date of Patent: Mar. 3, 2015

(54) NANOLASER FOR GENERATING COHERENT ELECTROMAGNETIC RADIATION

(71) Applicant: King Saud University, Riyadh (SA)

(72) Inventor: Talal Ghannam, Riyadh (SA)

(73) Assignee: King Saud University, Riyadh (SA)

( * ) Notice: Subject to any disclaimer, the term of this patent is extended or adjusted under 35 U.S.C. 154(b) by 0 days.

(21) Appl. No.: 13/719,322

(22) Filed: Dec. 19, 2012

(65) Prior Publication Data

US 2013/0272335 A1   Oct. 17, 2013
US 2014/0064319 A2   Mar. 6, 2014

(30) Foreign Application Priority Data

Dec. 29, 2011   (EP) .................................... 11196020

(51) Int. Cl.
| | |
|---|---|
| *H01S 3/14* | (2006.01) |
| *H01S 3/09* | (2006.01) |
| *B82Y 20/00* | (2011.01) |
| *H01S 5/10* | (2006.01) |

(52) U.S. Cl.
CPC .   *H01S 3/09* (2013.01); *B82Y 20/00* (2013.01); *H01S 5/1042* (2013.01); *H01S 5/1046* (2013.01)
USPC ............................................. 372/69; 372/39

(58) Field of Classification Search
CPC ............... H01S 3/09; H01S 5/04; H01S 5/34; H01S 5/3036
USPC .......................................... 372/39, 43.01, 69
See application file for complete search history.

(56) References Cited

U.S. PATENT DOCUMENTS 7,079,240 B2 *   7/2006   Scherer et al. ................ 356/318
2006/0098705 A1 *   5/2006   Wang et al. ............... 372/50.124

OTHER PUBLICATIONS

Protsenko I E et al: "Dipole nano-laser", Journal of Physics: Conference Series, Institute of Physics Publishing, Bristol, GB, vol. 107, No. 1, Jan. 1, 2008, p. 012010, XP009159010.*
Protsenko et al.; Dipole Nanolaser; Physical Review A 71,063812 (2005).*
A. Rosenthal et al: "Dipole nanolasers: A study of their quantum properties", Physical Review A, vol. 79, No. 4, Apr. 1, 2009, XP55026107.*
Ghannam T: Dipole nano-laser: the effect of an external electric field; Dipole nano-laser: the effect of an external electric field, Journal of Physics B, Atomic Molecular and Optical Physics, Institute of Physics Publishing, Bristol, GB, vol. 43, No. 15, Jul. 20, 2010; p. 155505, XP020195806.
Francisco J. Garcia-Vidal et al: "Applied physics: Lasers go nano", Nature, vol. 461, No. 7264, Jan. 1, 2009, pp. 604-605, XP55014690.
European Search Report for corresponding European Patent Application No. 11196020.9 dated May 8, 2012.
Protsenko et al.; Dipole Nanolaser; Physical Review A 71, 063812 (2005).

* cited by examiner

*Primary Examiner* — Armando Rodriguez
(74) *Attorney, Agent, or Firm* — Renner, Otto, Boisselle & Sklar, LLP

(57) ABSTRACT

Nanolaser for generating coherent electromagnetic radiation, comprising at least one nanoparticle of metal, preferably silver, or semiconductor, at least one exciting element, preferably a quantum dot, for exciting plasmon resonance of the at least one nanoparticle, wherein the at least one nanoparticle and the at least one exciting element are embedded in a matrix of Photonic or Polaritonic Band-gap (PGB)-material, preferably Silica Carbide (SiC).

20 Claims, 3 Drawing Sheets

NANOLASER FOR GENERATING COHERENT ELECTROMAGNETIC RADIATION

TECHNICAL FIELD

The present invention relates to a Photonic/Polaritonic Band-gap nanolaser and in particular a nano-scale system for generating nearly monochromatic light pulses. Especially, the present invention relates to a nanolaser for generating coherent electromagnetic radiation and methods of generating a coherent stream of photons using nano-scale elements.

BACKGROUND

Nano-scale systems have demonstrated many novel and interesting optical properties. These systems are extremely important for future photon-based devices among many other applications. Being able to manufacture miniature light sources that have very small spectral width (e.g. lasers) is of utmost importance for science and industrial light.

Many different configurations of nanolasers have been proposed in the literature, such as surface polariton lasing, quantum dots and nano wire lasers etc. However they are either big in size or have large spectral width for the emitted light.

For example D. J. Bergman and M. I. Stockman, Phys. Rev. Lett. 90,027402, 2003, proposed putting a quantum dot close to a nanoparticle to stimulate its plasmon resonance They proposed a coherent near field emission of the system which they called "Spaser" or "Surface Plasmon Amplification by Stimulated Emission of Radiation".

RU 2249278 C2 discloses a method and dipole nanolaser (DNL) for generation of coherent electromagnetic radiation. The DNL consists of a two-tier system in the form of quantum dots and metallic or semiconductor nanoparticles with a size smaller than the wavelength of the radiation, placed in a transparent medium at a distance from each other. A detailed theoretical study of the DNL conducted by A. S. Rosenthal and Talal Ghannam (Physical Review A 79, 043824, 2009) has shown that the light emitted by the DNL has a very broad spectral width, around $10^{15}$ Hz, even larger than the spectral width of the nanoparticle or the exciting element, which means that the system is not lasing at all. This was later corroborated by an experiment conducting by Markus Pfeiffer et al, Nano Lett. 10, 4555-4558, 2010, where the spectral width emitted from gold nanoparticles had a spectral width same as that of the nanoparticle and not less. To reduce the spectral width of the DNL, Rosenthal et al needed to increase the pumping of the quantum dot to unrealistic values, e.g. in the ultraviolet region.

SUMMARY

Accordingly, it is therefore an object of the invention to provide a nano-scaled light source that can generate light with smaller spectral width, e.g. almost monochromatic, like conventional lasers do.

This aim is achieved by a nanolaser for generating coherent electromagnetic radiation, comprising at least one nanoparticle of metal, preferably silver, or semiconductor, at least one exciting element, preferably a quantum dot, for exciting plasmon resonance of the at least one nanoparticle, wherein the at least one nanoparticle and the at least one exciting element are embedded in a matrix of Photonic or Polaritonic Band-gap (PGB)-material, preferably Silica Carbide (SiC).

The exciting element works as a pumping means (mechanism) situated close to the metallic or semiconductor nanoparticle.

PBG-materials are characterized by having a gap in their dispersion relation characterized by an upper and lower energy band, corresponding to frequencies of light that are forbidden to propagate with the PBG-material.

According to a preferred embodiment, the at least one exciting element has two active energy levels.

Preferably, the nanolaser further comprises a pumping means for pumping the at least one exciting element.

A special embodiment comprises only a single nanoparticle of metal or semiconductor and only a single exciting element.

In particular, the nanoparticle can be spherical and can have a diameter $r_1$, the exciting element can be spherical and can have a diameter $r_2$ and preferably the distance R between the nanoparticle and the exciting element is as follows:

$$R \leq (r_1 + r_2) + \max(2r_1, 2r_2).$$

An alternative embodiment comprises at least two nanoparticles of metal or semiconductor and only a single exciting element.

Alternatively, the nanolaser comprises only a single nanoparticle of metal or semiconductor and at least two exciting elements.

Finally, a further special embodiment comprises at least two nanoparticles of metal or semiconductor and at least two exciting elements, preferably wherein the nanoparticles are arranged in a layer or layers and/or the exciting elements are arranged in a layer or layers. The layer(s) can consist of the PGB-material.

All of the embodiments that comprise more than one nanoparticle and/or more than one exciting element can be considered as ensembles.

The present invention is based on the unexpected conclusion that the PBG-material changes the optical properties of the emitted light significantly in that it reduces the spectral width with an order of about 1000 or more compared to the previous works depending on the material use for the nanoparticle(s). The line width of the laser (system) is reduced far below that of the nanoparticle(s) itself/themselves to the region where a coherent light is actually produced and real lasing is happening.

Moreover, an amplification of the intensity of the light emitted by the nanolaser (system) of order of hundreds of times is also observed from the calculations. All of this can be achieved using reasonable values for the pumping frequencies of the exciting element (usually in the infrared region).

The present invention provides a nanolaser that combines both a very small size and very narrow spectral width of the emitted light.

BRIEF DESCRIPTION OF THE DRAWINGS

Further features and advantages of the invention will be come clear from the claims and the following description, in which embodiments of the invention are illustrated in detail with reference to the schematic drawings:

DETAILED DESCRIPTION

Figure 1:
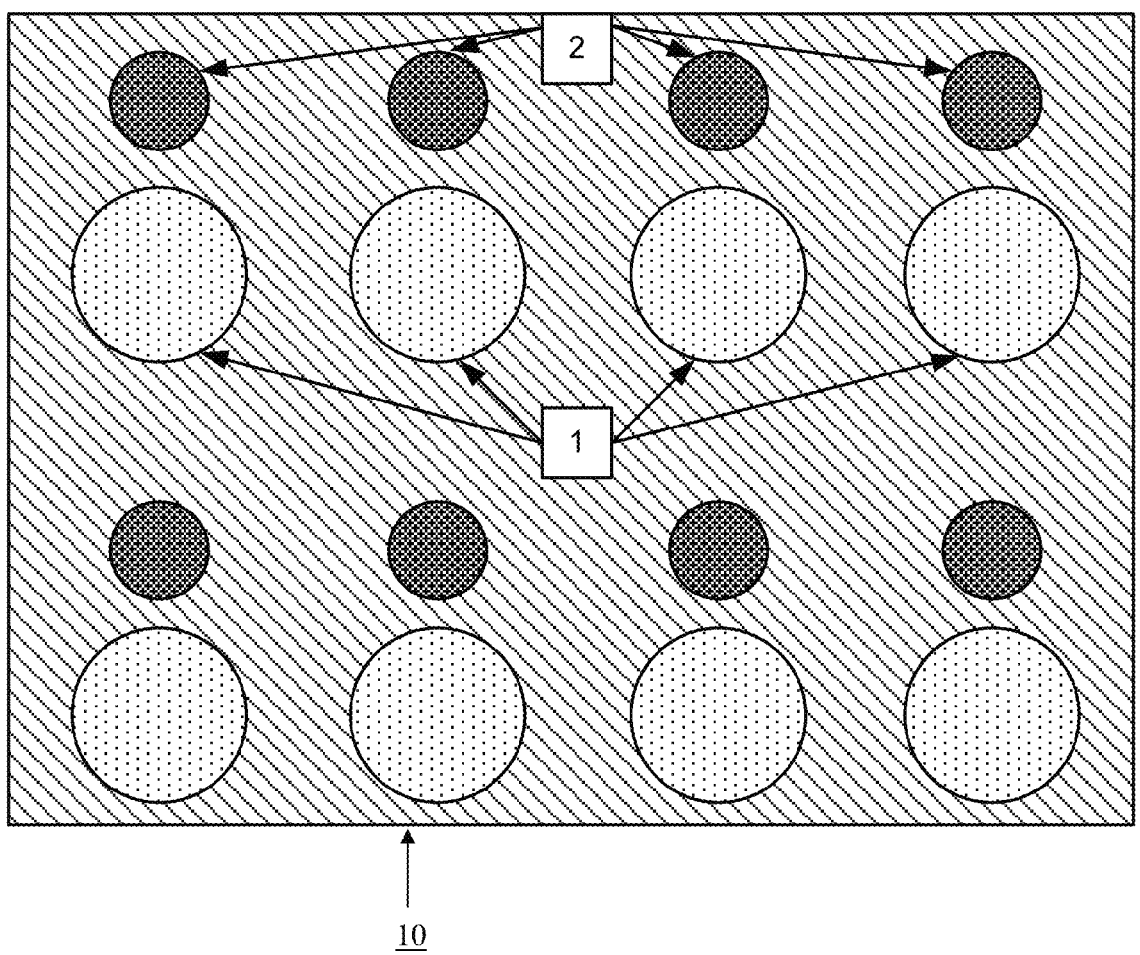
FIG. 1 shows a scheme of a nanolaser according to a special embodiment of the invention.

FIG. 1 shows a scheme of a nanolaser according to a special embodiment of the present invention. Said nanolaser 10 for generating coherent electromagnetic radiation comprises a single nanoparticle 1 of metal, preferably silver, or semiconductor and a single exciting element 2 in the form of a quantum dot for exciting plasmon resonance of the nanoparticle 1. In other words, the exciting element 2 works as a pumping mechanism situated close to the nanoparticle 1. The whole system is embedded within a matrix 3 of Polaritonic or Photonic Band Gap (PGB)-material, e.g. Silica Carbide.

The nanoparticle 1 has a diameter $r_1$ and the exciting element 2 has a diameter $r_2$. The distance between the nanoparticle 1 and the exciting element 2 is R.

The exciting element 2 is pumped by a suitable pumping means (not shown). Said pumping means can work optically, electrically or chemically etc. Further, the exciting element 2 is coupled to the nanoparticle 1 to excite its plasmon modes. The excited plasmon modes, when de-excited, emit photons having certain spectral width. The usage of the PBG-material has the effect of reducing the spectral width of the emitted light of the nanolaser (system) much below that emitted by the exciting element 2 and the nanoparticle 1 when embedded within non-PBG-materials.

The exciting element 2 is suitably tuned to excite the plasmon modes of the nanoparticle 1. It can come in any shape, configuration and material. Its sole role is to provide suitable excitation to the nanoparticle 1.

The nanoparticle 1 has one or several plasmon resonances. It will absorb the energy coming out of the exciting element 2 and turns it into streams of photons. The nanoparticle 1 can have any shape or size that makes it suitable to the desired operation.

Although in FIG. 1 the nanoparticle 1 and the exciting element 2 are shown as spherical, this is not necessary. They can take any shape for getting the desired results. For example, the nanoparticle 1 can have a non-isomorphic shape that can support multiple plasmon resonances. Thus, by tuning the exciting element 2 to these resonances, photons with different colors can be generated.

Also, the invention is not restricted to a single system. An ensemble of the system is also possible (see FIGS. 2 and 3 and the description below).

The nanolaser 10 can for example have the following dimensions:

Based on an exemplarily chosen diameter $r_1=14$ nm of the nanoparticle 1 and an exemplarily chosen diameter $r_2=10$ nm of the exciting element 2 and a distance between the exciting element 2 and the nanoparticle 1 of R=20 nm, the dimension of the nanolaser 10 in its basic configuration (the exciting element 2 plus nanoparticle 1 plus the distance in between) will be around $r_2/2+R+r_1/2=5$ nm+20 nm+7 nm=32 nm ($10^{-9}$ m).

Further, preferably the PBG-material is Silica Carbide (SiC) and the nanoparticle 1 consists of silver or gold.

For a silver nanoparticle 1 embedded within SiC-material a spectral width of $9.7\times10^{11}$ Hz at the silver plasmon resonance of $1.2221\times10^{15}$ Hz was achieved. The enhancement factor (the amplification) of the light coming out of the nanolaser was around 470 times. This was done for a pumping rate of $6.5\times10^{14}$ Hz.

It is to be noted that basically there is no strict restriction on the dimensions of the exciting element 2 and the nanoparticle 1. These can be chosen depending on the experimenter or manufacturer will. The nanoparticles can range from a few nanometers to thousands of them. The exciting element size depends on its configuration. Quantum dots can be as small as a few nanometers across. Nevertheless, the smaller the nanolaser (system), the better.

However, some restrictions on the in-between distance R could be beneficial. The nanoparticle 1 and the exciting element 2 should not be to close for the quadrupole moments to have a great effect on the nanolaser (system) and also should not be to far such that the nanoparticle 1 and the exciting element 2 can not interact through their near field dipole-dipole interaction.

Preferably the distance R should be $R=(r_1/2+r_2/2)+\max(r_1,r_2)$.

So for example for $r_1/2=7$ nm (diameter of the nanoparticle 1) and $r_2/2=5$ nm (diameter of the exciting element 2), R should be equal or less than 26 nm. Preferably, R should be a little bit smaller than that. For example, 20 nm is a good value. However, it is to be noted that these are theoretical restrictions. The actual experimental values can be a bit different.

Regarding the frequency of the system, this depends on the plasmon resonance of the material of the nanoparticle. For example, the plasmon resonance of bulk silver is around $5\times10^{15}$ Hz. However, it also depends on the size of the nanoparticle. The resonance frequency can be found as the maximum of the following equation:

$$Ep(\omega, a) := \frac{\varepsilon_1(\omega, a) - \varepsilon 1\left(2\cdot\pi\cdot\frac{c}{\omega\cdot 10^{-6}}\right)}{\varepsilon_1(\omega, a) + 2\varepsilon 1\left(2\cdot\pi\cdot\frac{c}{\omega\cdot 10^{-6}}\right)}$$

Where a is the radius of the nanoparticle and c is the speed of light and $\in_1$ and $\in 1$ are the real values of the dielectric constant of silver and the surrounding medium (PBG). So for a nanoparticle of silver with a radius of 7 nm the value will be around $1.2221\times10^{15}$ Hz.

Each material has its own distinctive plasmon resonance depending on the material of the surrounding matrix. The wave length of the light emitted is directly proportional to the operating resonance frequency through the relation $\lambda=c/2\pi\omega$, where c is the speed of light and $\omega$ is the frequency of the light.

The spectral width depends directly on this value. It also depends on the value of the pumping. The more the pumping, the narrower the spectral width and vice versa.

So the range of the spectral width depends on the range of the pumping, which depends on technical and industrial issues. For pumping ranging from $10^{13}$ Hz to $10^{16}$ Hz, the range of the spectral width of the light coming out of a silver nanoparticle embedded within Silica Carbide matrix is predicted to be around $1\times10^{13}$ to $1\times10^{10}$ Hz, respectively.

Figure 2:
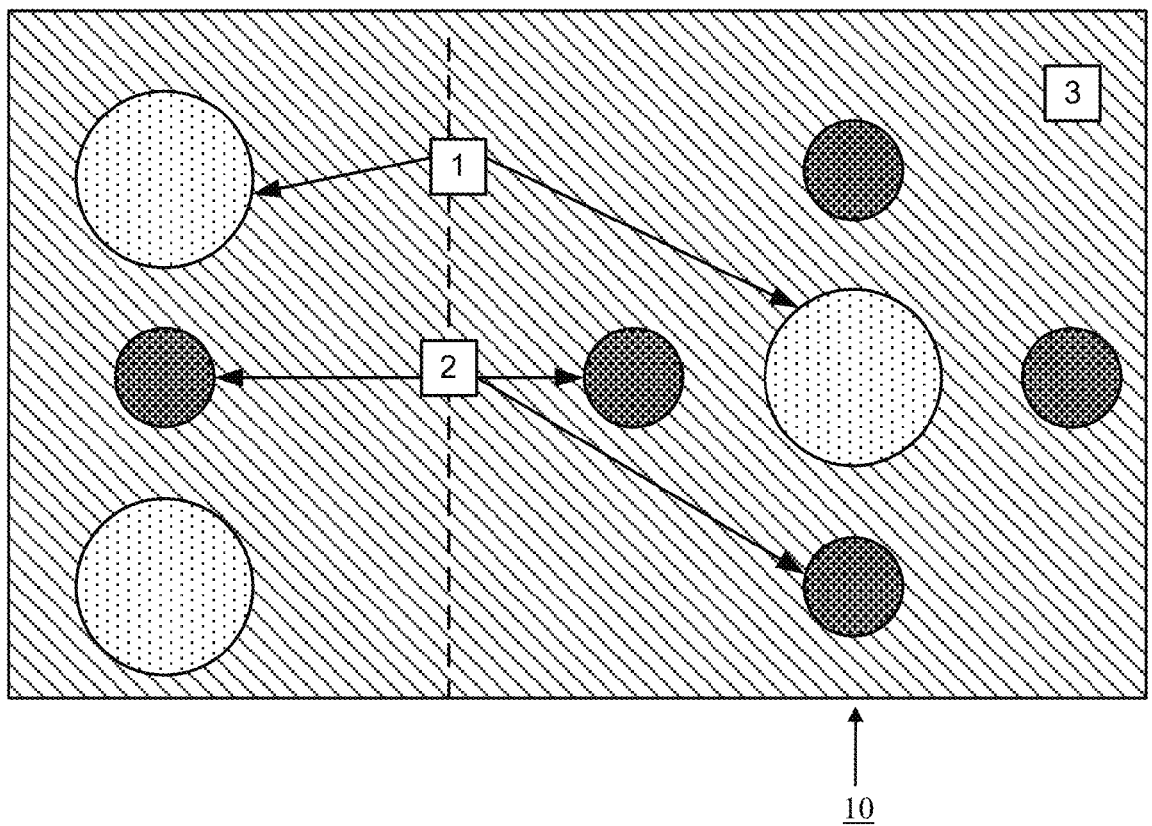
FIG. 2 shows a scheme of a nanolaser according to another special embodiment of the invention.
Figure 3:
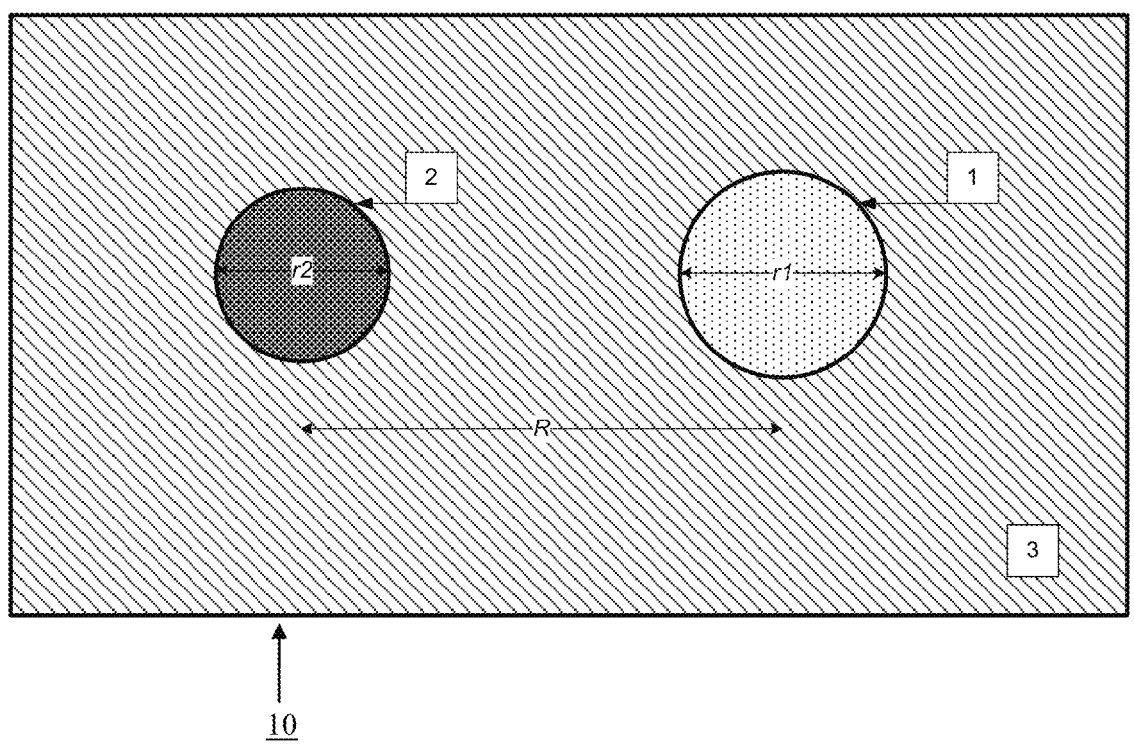
FIG. 3 shows schemes of a nanolaser according to another special embodiments of the invention.

FIG. 2 shows an ensemble of spherical nanoparticles 1 (only some of them are indicated) and several exciting elements 2 (only some of them are indicated) in the form of quantum dots in a nanolaser according to another special embodiment of the invention.

As shown in FIG. 2, several exciting elements 2 could be arranged within a layer or large slab of PBG-material as the matrix 3. Next one can embed many nanoparticles 1 below this layer of exciting elements 2. Whether there will be cross interaction between adjacent elements or not depends on the will of the experimenter and how careful he is in placing in these elements next to each other.

Moreover, one can use a single exciting element 2, for example, to excite several nanoparticles 1 situated around it. On the left side of FIG. 3 one exciting element 2 exciting two nanoparticles 1 is shown, whereas on the right side of said figure, four exciting elements 2 exciting one nanoparticle 1 are shown. So it is shown that an ensemble of several nanoparticles 1 and several exciting elements 2 can be used well.

The features disclosed in the foregoing description, in the claims and/or in the accompanying drawings may, both separately and in any combination thereof, be material for realising the invention in diverse forms thereof.

Reference Signs 1 nanoparticle(s)
2 exciting element(s)
3 matrix of PBG-material
10 nanolaser
$r_1$ diameter of nanoparticle
$r_2$ diameter of exciting element
R distance between nanoparticle and exciting element

The invention claimed is:

1. Nanolaser for generating coherent electromagnetic radiation, comprising
at least one nanoparticle of metal,
at least one exciting element for exciting plasmon resonance of the at least one nanoparticle,
wherein the at least one nanoparticle and the at least one exciting element are embedded in a matrix of Photonic or Polaritonic Band-gap (PGB)-material,
wherein the at least one exciting element is a quantum dot, and
wherein the at least one nanoparticle is formed of silver or gold, and the Photonic or Polaritonic Band-gap (PBG)-material is Silica Carbide (SiC).

2. Nanolaser according to claim 1, wherein the at least one exciting element has two active energy levels.

3. Nanolaser according to claim 1, further comprising a pumping means for pumping the at least one exciting element.

4. Nanolaser according to claim 1, comprising only a single nanoparticle and only a single exciting element.

5. Nanolaser according to claim 4, wherein the nanoparticle is spherical and has a diameter $r_1$, the exciting element is spherical and has a diameter $r_2$ and the distance R between the nanoparticle and the exciting element is as follows:

$$R \leq (r_1/2 + r_2/2) + \max(r_1, r_2).$$

6. Nanolaser according to claim 1, comprising at least two nanoparticles and only a single exciting element.

7. Nanolaser according to claim 1, comprising only a single nanoparticle and at least two exciting elements.

8. Nanolaser according to claim 1, comprising at least two nanoparticles and at least two exciting elements.

9. Nanolaser according to claim 2, further comprising a pumping means for pumping the at least one exciting element.

10. Nanolaser according to claim 2, comprising only a single nanoparticle and only a single exciting element.

11. Nanolaser according to claim 10, wherein the nanoparticle is spherical and has a diameter $r_1$, the exciting element is spherical and has a diameter $r_2$ and the distance R between the nanoparticle and the exciting element is as follows:

$$R \leq (r_1/2 + r_2/2) + \max(r_1, r_2).$$

12. Nanolaser according to claim 3, comprising only a single nanoparticle and only a single exciting element.

13. Nanolaser according to claim 12, wherein the nanoparticle is spherical and has a diameter $r_1$, the exciting element is spherical and has a diameter $r_2$ and the distance R between the nanoparticle and the exciting element is as follows:

$$R \leq (r_1/2 + r_2/2) + \max(r_1, r_2).$$

14. Nanolaser according to claim 9, comprising only a single nanoparticle and only a single exciting element.

15. Nanolaser according to claim 14, wherein the nanoparticle is spherical and has a diameter $r_1$, the exciting element is spherical and has a diameter $r_2$ and the distance R between the nanoparticle and the exciting element is as follows:

$$R \leq (r_1/2 + r_2/2) + \max(r_1, r_2).$$

16. Nanolaser according to claim 8, wherein the nanoparticles are arranged in a layer or layers.

17. Nanolaser according to claim 8, wherein the exciting elements are arranged in a layer or layers.

18. Nanolaser for generating coherent electromagnetic radiation, comprising
at least one nanoparticle of silver or gold or semiconductor,
at least one exciting element for exciting plasmon resonance of the at least one nanoparticle,
wherein the at least one nanoparticle and the at least one exciting element are embedded in a matrix of Photonic or Polaritonic Band-gap (PBG)-material, the at least one exciting element is a quantum dot, the Photonic or Polaritonic Band-gap (PBG)-material is Silica Carbide (SiC), the at least one exciting element has two active energy levels and the nanolaser further comprises a pumping means; and
wherein the Photonic or Polaritonic Band-gap (PBG)-material reduces spectral width of light emitted by the nanolaser with an order of about 1000 or more compared to a material other than the Photonic or Polaritonic Band-gap (PBG)-material.

19. Nanolaser according to claim 18, wherein intensity of the light emitted by the nanolaser is amplified at least one hundred times compared to a material other than the Photonic or Polaritonic Band-gap (PBG)-material.

20. Nanolaser according to claim 1, wherein
the Photonic or Polaritonic Band-gap (PBG)-material reduces spectral width of light emitted by the nanolaser with an order of about 1000 or more compared to a material other than the Photonic or Polaritonic Band-gap (PBG)-material, or
intensity of the light emitted by the nanolaser is amplified at least one hundred times compared to a material other than the Photonic or Polaritonic Band-gap (PBG)-material, or
both the Photonic or Polaritonic Band-gap (PBG)-material reduces spectral width of light emitted by the nanolaser with an order of about 1000 or more compared to a material other than the Photonic or Polaritonic Band-gap (PBG)-material, and intensity of the light emitted by the nanolaser is amplified at least one hundred times compared to a material other than the Photonic or Polaritonic Band-gap (PBG)-material.

* * * * *